(12) United States Patent
Wakrat et al.

(10) Patent No.: US 9,189,386 B2
(45) Date of Patent: Nov. 17, 2015

(54) DYNAMICALLY ALLOCATING NUMBER OF BITS PER CELL FOR MEMORY LOCATIONS OF A NON-VOLATILE MEMORY

(71) Applicant: Apple Inc., Cupertino, CA (US)

(72) Inventors: Nir Jacob Wakrat, Los Altos, CA (US); Tahoma M. Toelkes, San Jose, CA (US)

(73) Assignee: APPLE INC., Cupertino, CA (US)

( * ) Notice: Subject to any disclaimer, the term of this patent is extended or adjusted under 35 U.S.C. 154(b) by 75 days.

(21) Appl. No.: 13/830,233

(22) Filed: Mar. 14, 2013

(65) Prior Publication Data

US 2014/0019673 A1    Jan. 16, 2014

Related U.S. Application Data

(63) Continuation of application No. 12/712,540, filed on Feb. 25, 2010, now Pat. No. 8,402,243.

(51) Int. Cl.
*G06F 12/02* (2006.01)
*G11C 11/56* (2006.01)

(52) U.S. Cl.
CPC ........ *G06F 12/0246* (2013.01); *G11C 11/5628* (2013.01); *G11C 11/5642* (2013.01); *G06F 2212/7202* (2013.01); *G11C 2211/5641* (2013.01)

(58) Field of Classification Search
CPC ... G06F 11/1048; H01L 27/222; H01L 27/24; H01L 45/06; H01L 45/1233; H01L 45/143; H01L 45/144; H01L 45/148; H01L 45/1616; H01L 27/101; H01L 27/11529; G11C 11/5628; G11C 16/0483; G11C 16/10; G11C 16/04; G11C 11/5642; G11C 2211/5621; G11C 16/3418; G11C 16/3454; G11C 13/0004; G11C 16/34; G11C 16/3459; G11C 11/5621; G11C 13/0069; G11C 16/26
USPC .......................................................... 711/170
See application file for complete search history.

(56) References Cited

U.S. PATENT DOCUMENTS

| | | | |
|---|---|---|---|
| 6,643,169 B2 | 11/2003 | Rudelic et al. | |
| 2005/0273548 A1 | 12/2005 | Roohparvar | |
| 2008/0043527 A1 | 2/2008 | Aritome | |
| 2010/0122016 A1* | 5/2010 | Marotta et al. | 711/103 |

* cited by examiner

*Primary Examiner* — Yong Choe
(74) *Attorney, Agent, or Firm* — Van Court & Aldridge LLP (57) ABSTRACT

Systems and methods are provided for dynamically allocating a number of bits per cell to memory locations of a non-volatile memory ("NVM") device. In some embodiments, a host may determine whether to store data in the NVM device using SLC programming or MLC programming operations. The host may allocate an erased block as an SLC block or MLC block based on this determination regardless of whether the erased block was previously used as an SLC block, MLC block, or both. In some embodiments, to dynamically allocate a memory location as SLC or MLC, the host may provide an address vector to the NVM package, where the address vector may specify the memory location and the number of bits per cell to use for that memory location.

14 Claims, 6 Drawing Sheets

# DYNAMICALLY ALLOCATING NUMBER OF BITS PER CELL FOR MEMORY LOCATIONS OF A NON-VOLATILE MEMORY

CROSS-REFERENCE TO RELATED APPLICATIONS

This application is a continuation of U.S. patent application Ser. No. 12/712,540 filed Feb. 25, 2010 (now U.S. Pat. No. 8,402,243), which is incorporated herein in its entirety.

FIELD OF THE INVENTION

This can relate to dynamically allocating the number of bits per cell for memory locations (e.g., blocks) of a non-volatile memory, such as a flash memory.

BACKGROUND OF THE DISCLOSURE

NAND flash memory, as well as other types of non-volatile memories ("NVMs"), are commonly used for mass storage. For example, consumer electronics such as portable media players often include raw flash memory or a flash card to store music, videos, and other media.

Conventional flash memory may include arrays of memory cells composed of floating gate transistors. Charge may be stored or left off of each transistor's floating gate in order to store bits of data. For example, the floating gate of a transistor may be charged to indicate a bit value of '0' or may be left uncharged to indicate a bit value of '1.' The charge or lack thereof may affect a transistor's threshold voltage, which a controller for the non-volatile memory may sense by applying a reference voltage to the transistor. Such non-volatile memories that store one bit per cell are commonly referred to as "single-level cell" ("SLC") NVMs.

To increase the storage capacity of a non-volatile memory while maintaining a small NVM size, some current non-volatile memories may store multiple bits of data in each memory cell by varying the amount of charge stored in the floating gate of a transistor. Such NVMs that store more than one bit per cell are commonly referred to as "multi-level cell" ("MLC") NVMs. Since multi-level cells may have lower reliability than single-level cells, some non-volatile memories may have portions of their memory cells pre-allocated for MLC storage and other portions of their memory cells pre-allocated for SLC storage.

SUMMARY OF THE DISCLOSURE

Systems and methods are disclosed for dynamically allocating the number of bits per cell used for memory locations of a non-volatile memory, such as flash memory. In other words, instead of a memory location being pre-allocated as an MLC or SLC location, the MLC or SLC allocation of the memory location may be made during run-time of a memory system (e.g., electronic device, memory card, or USB drive).

In some embodiments, a memory system can include a host and a non-volatile memory ("NVM") package. The NVM package can include one or more NVM devices for storing information and may optionally include a NVM controller. The host may include a host controller for identifying a memory location in the NVM package to access and may instruct the NVM package to read data from, program data in, or erase data from the identified memory location (e.g., via the NVM controller).

The host can further determine whether to access the memory location as a single-level cell location or multi-level cell location. For example, the host can make this determination based on the desired storage reliability, storage performance, or storage speed. Thus, the host can use any suitable number of bits per cell when accessing the memory location regardless or independently of the number of bits per cell previously used for the same memory location. In other words, after each erase cycle on the memory location, the host can newly assign the memory location as an SLC or MLC memory location based on current needs or preferences.

In some embodiments, a host can dynamically allocate the number of bits per cell for a memory location using a portion of an address vector. The address vector can indicate the physical address of the memory location within the non-volatile memory by, for example, specifying the NVM device, the block, and page of the memory location. The address vector may also include a SLC/MLC indicator, which may indicate the number of bits per cell to use for the specified memory location. For example, in some embodiments, the SLC/MLC indicator may include one bit, where a first bit value (e.g., "0") may indicate SLC and a second bit value (e.g., "1") may indicate two-bit MLC.

The NVM package (e.g., via an NVM controller) may access the specified memory location based on the SLC/MLC indicator included in the address vector. For example, if the SLC/MLC indicator indicates that a specified block should be accessed as an SLC block, the NVM package may program the pages of the SLC block in a SLC page programming order, and if the SLC/MLC indicator indicates that the specified block should be accessed as an MLC block, the NVM package may program the pages in the MLC block in an MLC page programming order.

The host or the NVM package may maintain a mapping between the specified memory location and the number of bits per cell used when accessing the specified memory location (e.g., within a lookup table). This way, the memory location may be accessed using the appropriate SLC or MLC techniques during subsequent read, program, or erase operations.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Figure 1:
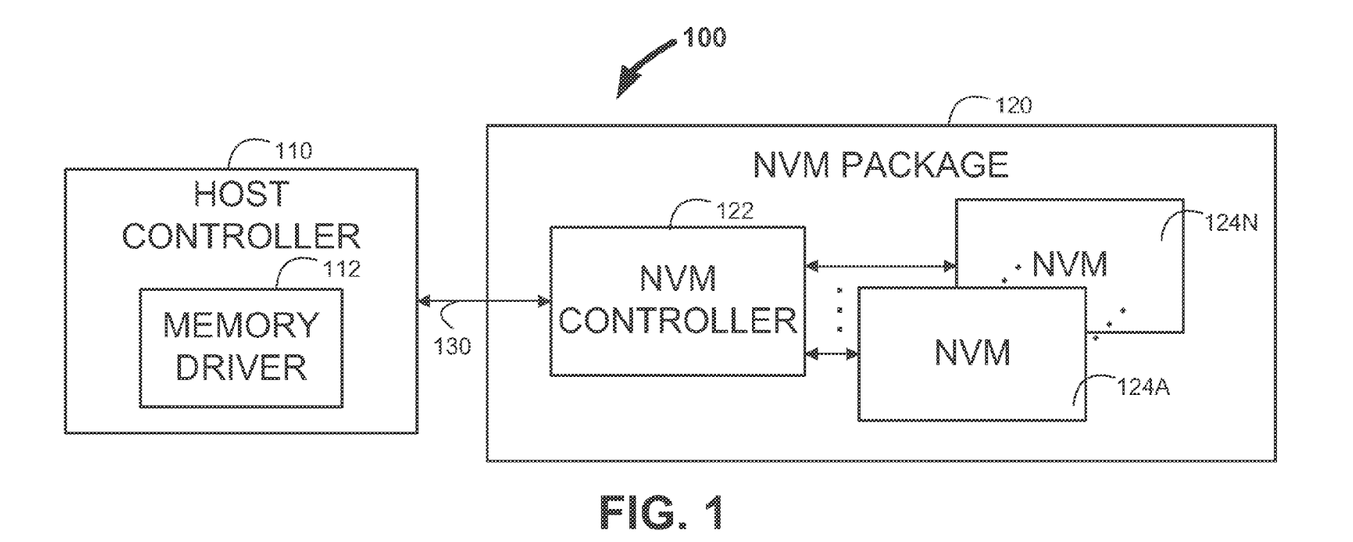
FIG. 1 is a schematic view of an illustrative memory system including a host controller and a managed non-volatile memory ("NVM") package configured in accordance with various embodiments of the invention.

FIG. 1 is a schematic view of memory system 100. Memory system 100 can include host controller 110 and non-volatile memory ("NVM") package 120. Host controller 110 can include one or more processors or microprocessors for executing software-based programs or may include any hardware-based components (e.g., application-specific integrated circuits ("ASICs")). Host controller 110 and optionally NVM package 120 can be implemented in any suitable host device or system, such as a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, or a laptop computer. For simplicity, the host device or system, which may include host controller 110, may sometimes be referred to simplicity as a "host."

NVM package 120 may be a ball grid array ("BGA") package or other suitable type of integrated circuit ("IC") package. In some embodiments, NVM package 120 may be included in a memory card or in a Universal Serial Bus ("USB") memory drive. Host controller 110 may communicate with NVM package 120 through host channel 130 using any suitable communications protocol. For example, and as described in greater detail below, for NAND systems, host controller 110 and NVM package 120 may communicate via a NAND interface or an extended NAND interface. Channel 130 may be referred to as a "host channel" because channel 130 may be visible to host controller 110 as opposed to being internal to NVM package 120. While only one NVM package 120 is illustrated in FIG. 1, memory system 110 can include any suitable number of NVM packages 120, which may each be in communication with host controller 110 through a host channel.

NVM package 120 can include NVM controller 122 coupled to any suitable number of NVM devices 124A-124N (e.g., one, two, three, four, or more devices). NVM controller 122 may include any suitable combination of processors, microprocessors, or hardware-based components (e.g., ASICs), and may include the same components as or different components from host processor 110. NVM devices 124A-124N may be or include IC dies and can include NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), any other known or future types of non-volatile memory technology, or any combination thereof. FIG. 1, as well as later figures and various disclosed embodiments, may sometimes be described in terms of using flash technology. However, this is merely illustrative and not intended to be limiting.

NVM devices 124A-124N can be organized into one or more "planes" which can concurrently carry out access operations from host controller 110 or NVM controller 122 (e.g., program, read, and erase operations). Each plane can include multiple "blocks" that may each be erasable at once, with its blocks further organized into "pages" that may each be programmable and readable at once. The blocks from corresponding NVM devices 124A-124N (e.g., blocks having the same position or block number) may form logical storage units referred to as "super blocks." NVM devices 124A-124N may include any suitable number of planes, blocks contained therein, and pages contained therein. For example, in some embodiments, each NVM device 124 may include two planes, where each plane can include 2048 blocks and each page can include 512 bytes. It should be understood that these numbers are merely illustrative and other suitable plane/block/page sizes may be implemented instead.

Physically, a block in any of NVM devices 124A-124N can include an array of memory cells aligned in rows corresponding to "word lines." The memory cells of a block may be configured as single-level cells ("SLC") or multi-level cells ("MLC"), and each word line in the block may be configured for use in storing one page (in a SLC case) or multiple pages (in a MLC case). Thus, the number of pages in a given block may be based on the number of bits stored per memory cell. Due to the increased density of storage, a block being used as a 2-bit MLC block may include twice the number of pages as when the same block is being used as an SLC block. In some embodiments, for example, for a block composed of 64 word lines, the block may include 64 pages when used as a SLC block, 128 pages when used as a 2-bit MLC block, 192 pages when used as a 3-bit MLC block, and so on. These numbers, however, are merely illustrative and a block of NVM devices 124A-124N may include any other suitable number of pages.

Host controller 110 and/or NVM controller 122 may be configured to perform memory management and access functions for NVM devices 124A-124N. This way, host controller 110 and/or NVM controller 122 can manage the memory locations (e.g., super blocks, pages, blocks, and planes) of NVM devices 124A-124N and the information stored therein. For example, via a processor implementation, host controller 110 can execute memory driver 112, which may provide vendor-specific and/or technology-specific instructions that enable host controller 110 to perform various memory management and access functions.

The memory management and access functions performed by host controller 110 and/or NVM controller 122 may include issuing read, write, or erase instructions and performing wear leveling, bad block management, garbage collection, decision-making on whether to allocate memory locations as SLC or MLC memory locations, logical-to-physical address mapping, error correction or detection, and data queuing to set up program operations. These and other functions may be allocated between host controller 110 and NVM controller 122 in any suitable manner. In some embodiments, a majority of the management and access functions may be performed by host controller 110, and in other embodiments, a majority of these functions may be performed by NVM controller 122. For example, in some cases, microcontroller 122 may perform error correction/detection and data queuing for NVM devices 124A-124N, while most or all of the other memory management and access functions may be allocated to host controller 110.

NVM package 120 may be referred to as a "managed NVM" package (or "managed NAND" for NAND flash memory). "Managed NVM" may refer to a memory device or package that includes a controller configured to perform at least one memory management function (e.g., error correction or detection). This may be in contrast to a "raw NVM" (or "raw NAND" for NAND flash memory), which can refer to a memory device or package that may be managed entirely by a host controller external to the NVM package. An example of a memory system that includes a raw NVM package will be described below in connection with FIG. 4.

In some embodiments, host controller 110 (e.g., via memory driver 112) may determine which memory location to access of NVM devices 124A-124N when storing and retrieving data. For example, memory driver 112 may obtain data from a block device driver or file system, an operating system ("OS"), or an application running on host controller 110. Responsive thereto, memory driver 112 may select a memory location (e.g., one or more pages, blocks, etc.) within NVM devices 124A-124N in which to store the obtained data and may instruct NVM controller 122 to store the data at the selected memory location. Host controller 110 may provide an address vector to NVM controller 110 to inform NVM controller 122 of the selected memory location.

Figure 2:
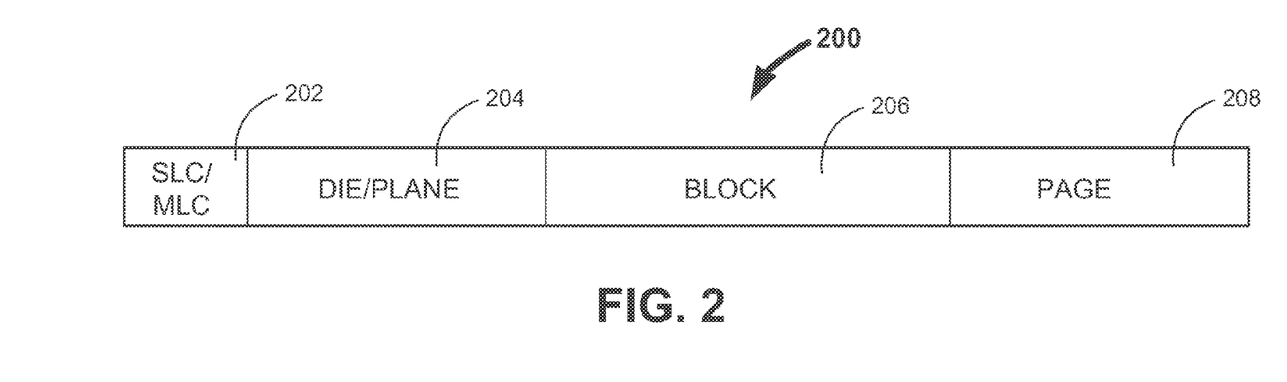
FIG. 2 is graphical view of an illustrative address vector, which includes a SLC/MLC indicator portion, in accordance with various embodiments of the invention.

FIG. 2 is a graphical view of an illustrative address vector 200 that host controller 110 may provide to NVM controller 122. Address vector 200 can include a number of digits (e.g., bits) that can be grouped into different portions 202, 204, 206, and 208. At least some of the portions may be used to specify the memory location of an NVM device to access (e.g., for program, read, or erase operations). For example, portion 204 may be used to indicate an IC die (e.g., one of NVM devices 124A-124N) or a plane within an IC die, portion 206 may be used to indicate a block within the specified IC die or plane, and portion 208 may be used to indicate a page within the specified die/plane and block.

The die/plane, block, and page indicators may specify the desired memory location using any suitable format. For example, block indicator portion 206 may provide a value corresponding to an offset within the specified die or plane, and page indicator portion 208 may provide a value corresponding to an offset within the specified block. As for the die/plane indicator, in some embodiments, NVM controller 122 may assign each of NVM devices 124A-124N and/or each plane a reference number, and therefore die/plane indicator 204 can specify the reference number of a desired die or plane. Using a reference number, host controller 110 can select a die and/or plane using a logical-type addressing scheme. The mapping between logical reference numbers and physical dies or planes may be maintained by NVM controller 122 so that host controller 110 may not need to keep track of which physical die or plane is being selected. It should be understood that die/plane indicator portion 204, block indicator portion 206, and page indicator portion 208 can include any suitable number of digits, and that FIG. 2 does not necessarily indicate the size of these portions relative to each other or to portion 202.

In some embodiments, address vector 200 can include portion 202 to indicate whether the memory location identified by the other digits in address vector 200 should be accessed as an MLC or SLC memory location. For example, portion 202 can include one bit within address vector 200, and host controller 110 can set the one bit to a first bit value (e.g., "0") to specify SLC and to a second bit value (e.g., "1") to specify two-bit MLC. As another example, portion 202 can include two bits, and host controller 110 can set the two bits to a first value (e.g., "00") to specify SLC, a second value (e.g., "01") to specify two-bit MLC, and a third value (e.g., "10") to specify three-bit MLC. In general, for binary digits, portion 202 can include X number of bits so that host controller 110 can specify up to 2^X different SLC or MLC options.

Using SLC/MLC indicator portion 202, host controller 110 can dynamically allocate whether an erased memory location should be programmed as SLC or as MLC. That is, regardless of whether the erased memory location was previously allocated as SLC or MLC, host controller 110 can use SLC/MLC indicator portion 202 to newly allocate the memory location as SLC or MLC until the next erase cycle on that memory location (at which time host controller 110 can again choose between SLC and MLC for that memory location).

Host controller 110 can decide between using SLC or MLC storage techniques for a memory location based on any of a variety of different factors. Because MLC storage may be less reliable and may slow down programming operations, host controller 110 can decide between SLC and MLC based on the storage reliability, storage performance, or storage speed desired for data currently being stored. For example, host controller 110 (e.g., via memory driver 112) may determine the desired reliability, performance, and speed based on how the data being stored was obtained (e.g., from which software module), any user inputs, or by request from a block device driver or file system, an OS, or application.

Host controller 110 may provide NVM controller 122 with address vector 200 over host channel 130. Along with address vector 200, NVM controller 122 may receive from host controller 110 any instructions (e.g., read, erase, program requests) and any data to be stored in the memory location specified by address vector 200. Responsive to receiving this information, NVM controller 122 may access the memory location specified by address vector 200 using any suitable techniques chosen based on the SLC/MLC indicator. NVM controller 122 and/or NVM devices 124A-124N may adjust any of its operations based on whether the specified location should be accessed using SLC or MLC techniques.

For example, on program operations on a specified block, NVM controller 122 may select a "page programming order" based on the number of bits per cell assigned to the specified block. The "page programming order" may refer to the sequence of word lines in an erased block used to program a sequence of pages. NVM controller 122 may use a first page programming order when a block is designated an SLC block via address vector 200 and may use a second page programming order when the block is designated an MLC block.

Figure 3:
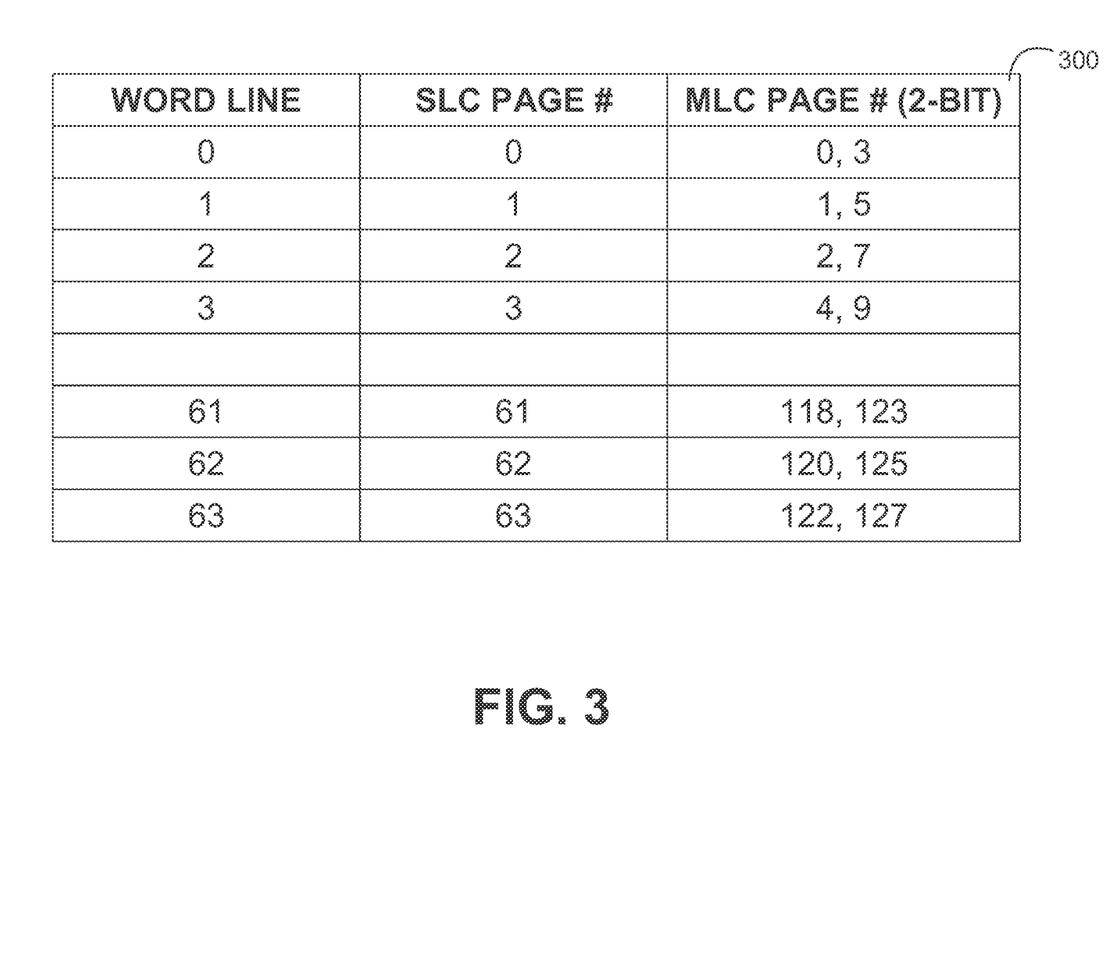
FIG. 3 is a table providing an illustrative page programming order for single-level cell ("SLC") blocks and two-bit multi-level cell ("MLC") blocks in accordance with various embodiments of the invention.

Turning to FIG. 3, table 300 illustrates possible page programming orders for SLC and two-bit MLC that NVM controller 122 may implement in accordance with various embodiments. It should be understood that this page programming order is merely illustrative and that other programming orders may be used instead. Also, for simplicity, table 300 illustrates a device that can store one page per word line when using SLC, but it should be understood that this may be extended to apply to devices that can store more than one page per word line when using SLC (e.g., devices that employ even and odd addressing). The first column of table 300 may represent the 64 word lines of an illustrative block within NVM devices 124A-124N. The second column of table 300 may indicate which word lines are used to store which pages for an SLC block in this example, where page 0 is programmed first, page 1 is programmed second, and so on. As illustrated, the word lines of the block may be filled in order from top to bottom when the block is allocated as an SLC block via address vector 200.

The third column of table 300 may indicate which word lines are used to store which pages for a two-bit MLC block in this example, where page 0 is programmed first, page 1 is programmed second, and so on. As illustrated, instead of programming the word lines from top to bottom twice, NVN controller 122 may return to the top after programming only three pages.

In other words, NVM controller 122 may program the fourth page (i.e., page 3) into the first word line with the first page (i.e., page 0). This way, any program disturb of page 0 on the first word line caused by programming page 1 on the second word line may be corrected by the time the fourth page is finished being programmed (instead of waiting to make necessary charge adjustments when programming a later page).

Thus, to aid in correcting read disturb issues (or for any other suitable reason), NVM controller 122 may select the page programming order based on whether SLC programming or MLC programming is selected (e.g., via address vector 200 of FIG. 2). For example, NVM controller 122 may use the SLC/MLC indicator to determine whether to program word line 3 or word line 0 when storing data in the fourth page (i.e., page 3) of the block. Because the SLC/MLC indicator may affect the programming order of pages in a block, in some embodiments, host controller 110 may be configured to dynamically allocate a number of bits per cell to a block or group of blocks at a time. The page programming order can be one of any suitable number of an NVM package's operations that may be affected by the SLC/MLC decision. For example, other operations that may be affected by the SLC/MLC indicator can include erase operations, read/erase/program verification functions, read/erase/program voltage signals and sensing techniques applied to the memory cells, and reference voltage generation.

For each memory location that may be dynamically allocated as SLC or MLC, host controller 110 or NVM controller 122 can keep track of whether SLC or MLC is currently being used for that memory location. In other words, once a memory location is programmed, a mapping may be maintained between that memory location and the SLC/MLC indicator currently used for that memory location. This way, when a memory location is accessed a second, third, or subsequent time after being programmed, NVM package 120 (e.g., via NVM controller 122) may be able to access the memory location using the appropriate SLC or MLC techniques.

In some embodiments, the mapping between physical addresses and SLC/MLC indicators may be maintained by host controller 122. For example, the mapping may be implemented as a lookup table stored on the host. In these embodiments, each time host controller 110 sends a request to NVM controller 122 to access a particular memory location, host controller 122 may examine the mapping to determine the appropriate number of bits per cell and may include this indication in an address vector (e.g., address vector 200 of FIG. 2) provided to NVM package 120.

In other embodiments, the mapping between physical addresses and SLC/MLC indicators may be maintained by NVM package 120 (e.g., by NVM controller 122). In these embodiments, NVM controller 122 may keep track of the mapping responsive to receiving an address vector (e.g., in the format of address vector 200 of FIG. 2) from host controller 110 and a request to program an erased block specified by the address vector. In subsequent accesses to that same memory location, NVM controller 122 may use its own maintained mapping to determine how to access the memory location. That is, NVM controller 122 may use the mapping maintained within NVM package 120 instead of looking to the SLC/MLC indicator portion of the address vector. In these embodiments, host controller 110 may only need to include correct indicator data in address indicator portion 202 of address vector 200 when a page is initially programmed.

Figure 4:
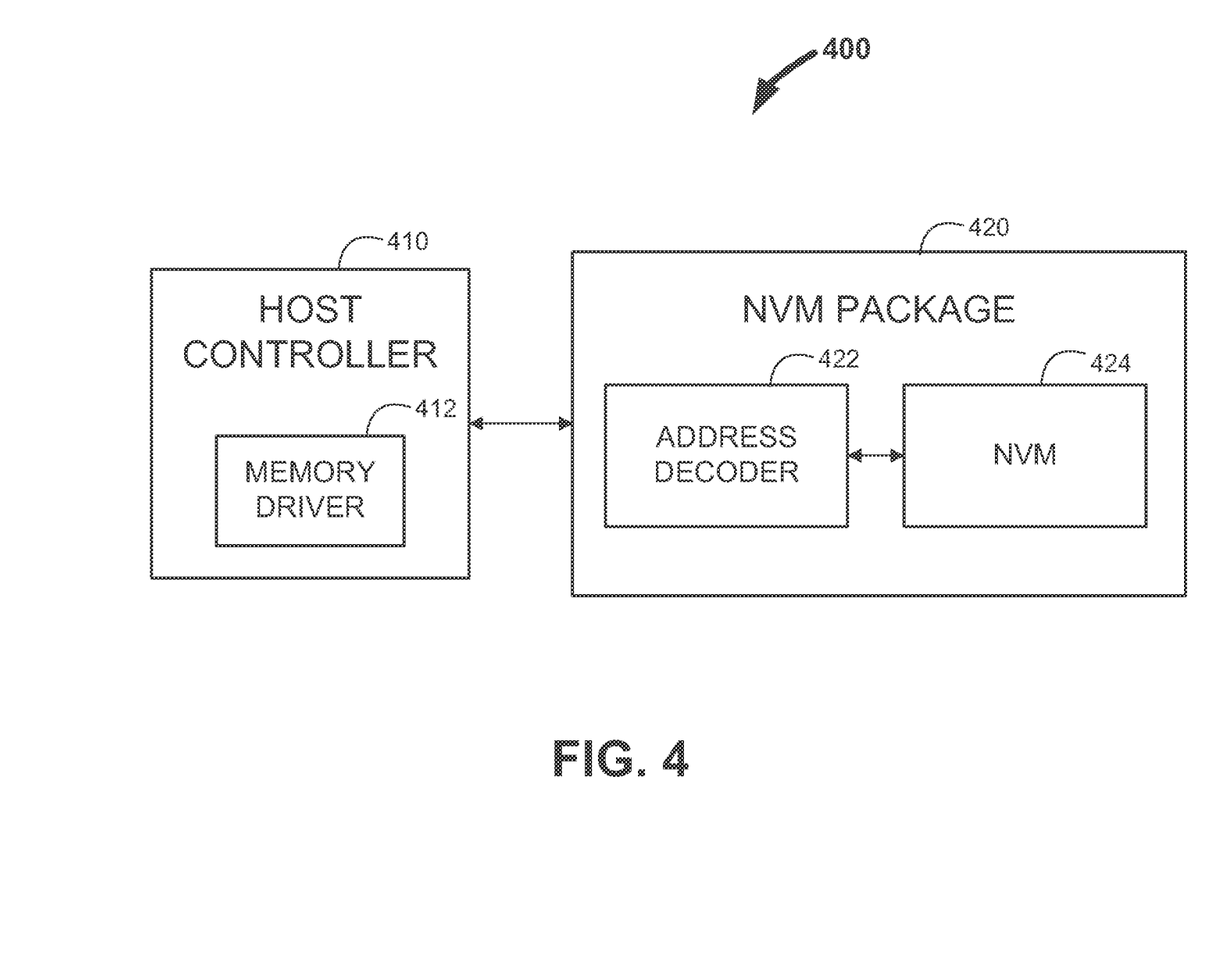
FIG. 4 is a schematic view of an illustrative memory system including a host controller and a raw NVM package configured in accordance with various embodiments of the invention.

In some embodiments, dynamic allocation of a memory location's number of bits per cell may be used for systems with raw NVM (e.g., raw NAND). FIG. 4 is a schematic diagram of memory system 400 that may include such a raw NVM package 420. Memory system 400 and its components may include any of the features and functionalities described above in connection with memory system 100 and its like-named components in FIG. 1, except that memory system 400 may include a raw NVM package 420 instead of managed NVM package 120. As described above, NVM package 420 may be referred to as "raw," because package 420 may not include an NVM controller that performs at least one management function. Also, while NVM package 420 is depicted with one NVM device 424, it should be understood that NVM package 420 can include multiple NVM devices 424.

Even without an NVM controller, host controller 110 (e.g., via memory driver 112) may provide a SLC/MLC indicator to NVM package 420 that specifies whether a requested memory location (e.g., block) should be accessed using SLC or MLC techniques. In some embodiments, instead of using a standardized inter-processor interface to exchange information, NVM package 420 may include proprietary input/output ("I/O") ports and/or I/O ports based on other interface standards. Some of the I/O ports may be used for receiving address information and any data to be stored in NVM device 424. One or more I/O ports may enable host controller 410 to provide a SLC/MLC indicator, which can take on any suitable format, such as any of the SLC/MLC indicator formats described above in connection with FIGS. 1 and 2.

NVM package 420, which may include address decoder 422 and NVM device 424, may use the SLC/MLC indicator obtained from host controller 410 when accessing NVM device 424. Address decoder 422 may decode any address information provided from host controller 410. For example, address decoder 422 may include a column decoder coupled to the bit lines of NVM device 424 and a row decoder coupled to the word lines of NVM device 424. Using column and row decoders, address decoder 422 may determine which memory locations to access responsive to receiving address information from host controller 410.

Address decoder 422 may decode the address information using the SLC/MLC indicator. For example, as described above, the page programming order of a specified block may change depending on whether SLC programming or MLC programming is used. Therefore, in some embodiments, address decoder 422 may decode the address information based on the SLC/MLC indicator such that a particular word line is selected. The SLC/MLC indicator may also affect the operation of circuitry in NVM package 420 other than address decoder 422, such as any verification, voltage generation, and reference control circuitry, for example.

Figure 5:
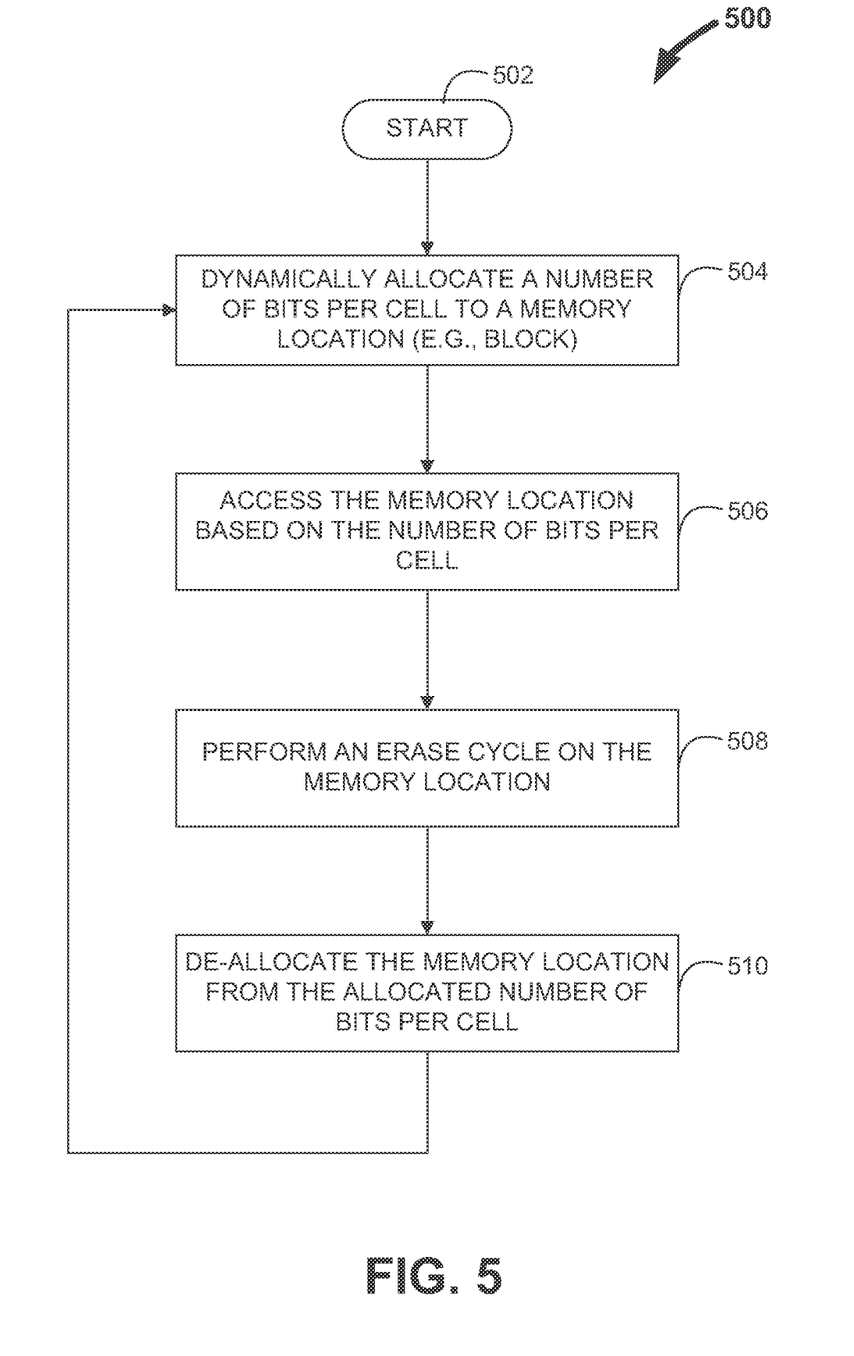
FIG. 5 is a flowchart of an illustrative process for dynamically allocating the number of bits per cell for a memory location of a non-volatile memory device in accordance with various embodiments of the invention.
Figure 6:
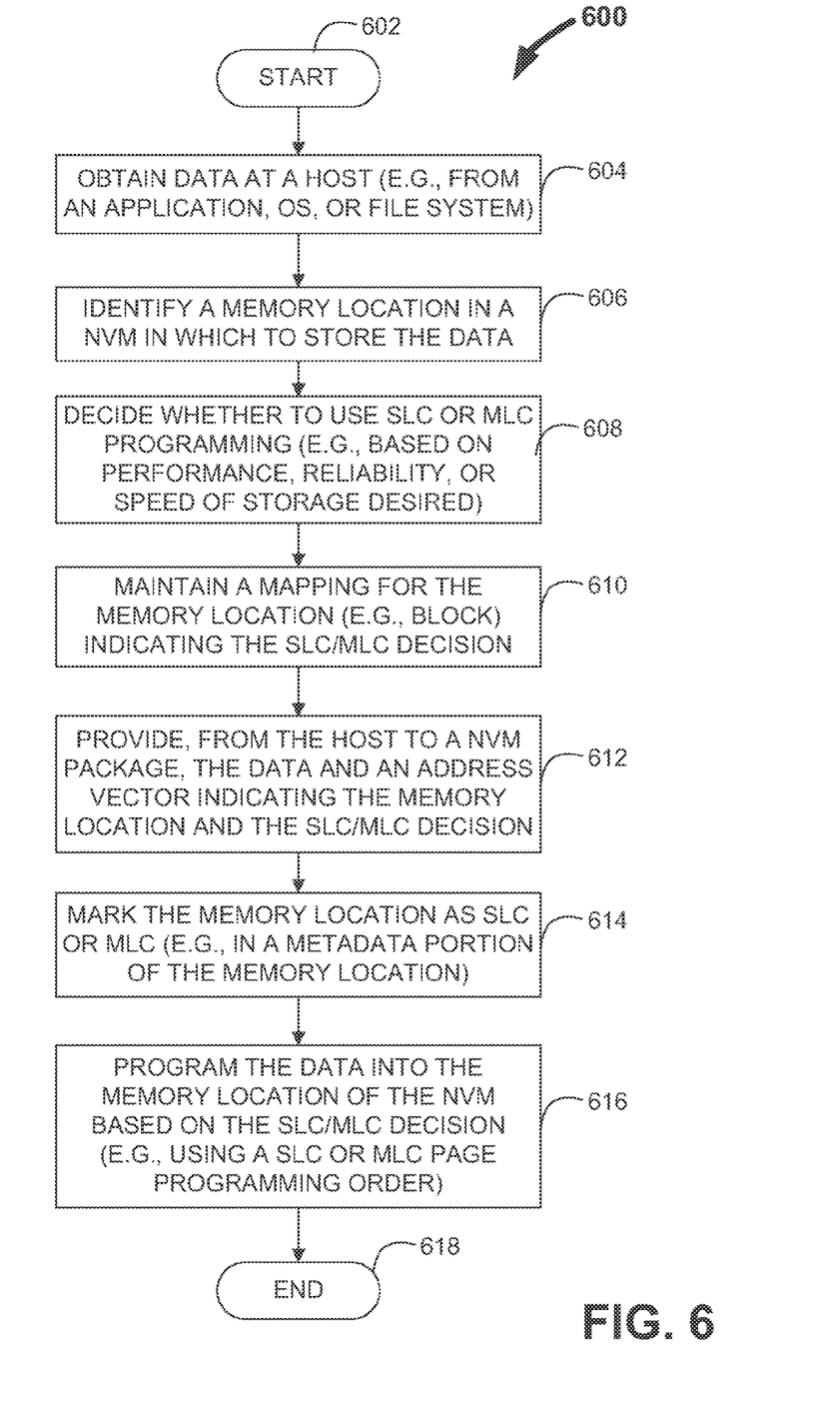
FIG. 6 is a flowchart of an illustrative process for storing data in a non-volatile memory using either SLC or MLC in accordance with various embodiments of the invention.
Figure 7:
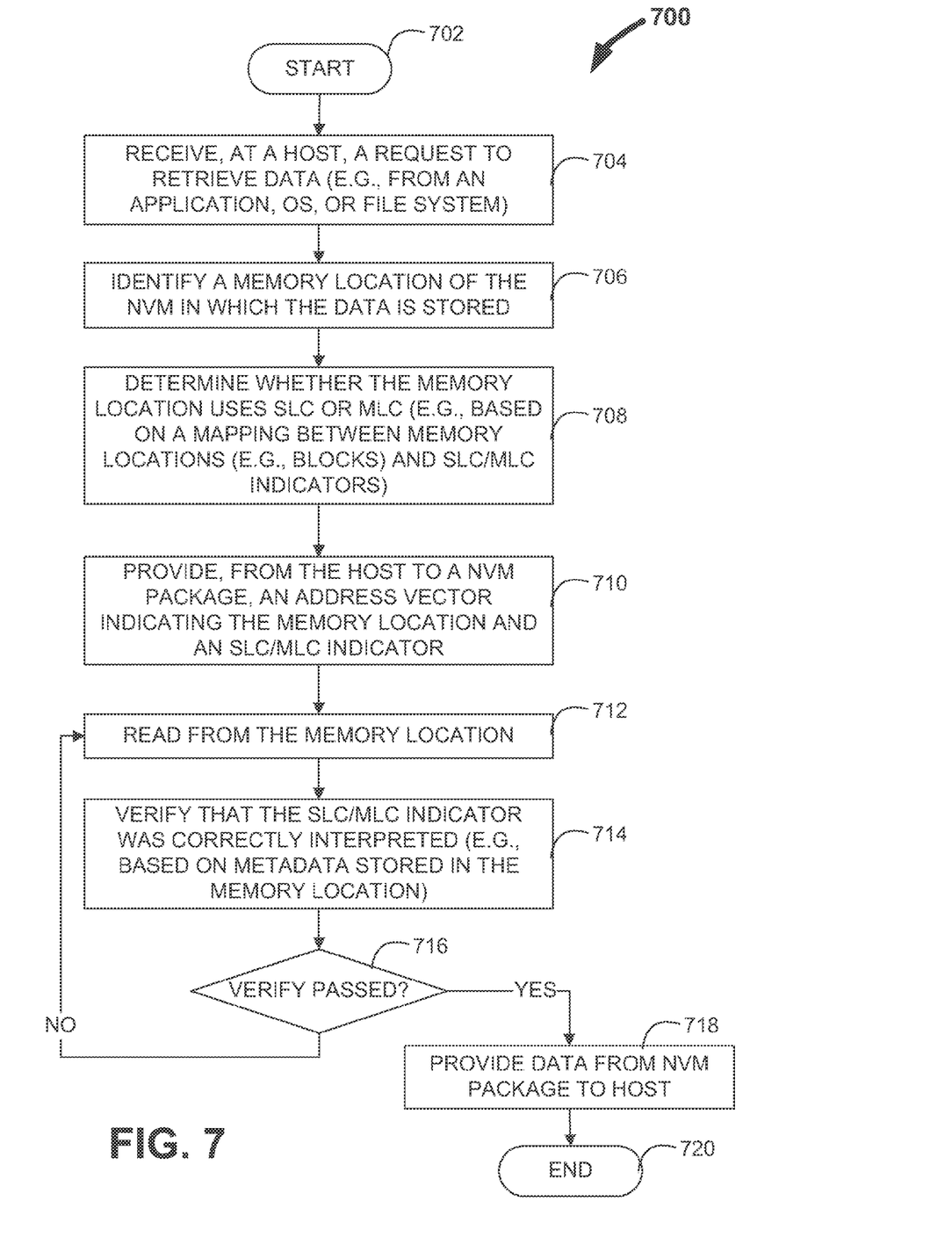
FIG. 7 is a flowchart of an illustrative process for reading data from a non-volatile memory using either SLC or MLC in accordance with various embodiments of the invention.

Referring now to FIGS. 5-7, flowcharts of illustrative processes are shown in accordance with various embodiments of the invention. These processes may be executed by one or more components in a memory system (e.g., memory systems 100 or 400 of FIGS. 1 and 4). For example, at least some of the steps in the processes of FIGS. 5-7 may be performed by memory driver 112 or 412 (FIGS. 1 and 4).

Turning first to FIG. 5, process 500 is shown for dynamically allocating the number of bits per cell for memory locations (e.g., blocks) of a non-volatile memory device, such as a flash memory device. Process 500 may begin at step 502, and at step 504, a number of bits per cell may be dynamically allocated to an erased memory location. The number of bits per cell may be any suitable number (e.g., one, two, three, or more bits) and may be allocated based on any suitable criteria or factor, such as the desired performance, speed, or reliability of storage for the information to be stored.

Then, at step 506, the memory location may be accessed based on the number of bits per cell assigned to that memory location. For example, on program and subsequent read operations, the page programming order may be determined based on the location's number of bits per cell. At step 508, once the data stored in the memory location is no longer needed (e.g., becomes obsolete, dirty, or invalid), an erase cycle may be performed on the memory location, such as during garbage collection operations executed on the non-volatile memory device. The memory location may then be de-allocated at step 510 from being associated with the number of bits per cell previously allocated to the memory location. This way, the memory location may go back into the pool of available memory locations that may be used. That is, at this time, process 500 may return to step 504 so that a new number of bits per cell may be allocated to the same memory location. During this second iteration and any subsequent iterations through process 500, the number of bits per cell may be selected independently of any previous allocations and may be based on current needs and preferences. Thus, as illustrated in FIG. 5, the number of bits per cell may change (if desired) after each deallocation and erase cycle on the memory location.

Turning now to FIG. 6, process 600 is shown for storing data into one or more memory locations (e.g., pages) of a non-volatile memory device, such as a flash memory. The NVM device may be included in an NVM package, which may be a raw NVM package or a managed NVM package (e.g., including an NVM controller). In some embodiments, process 600 may represent a more detailed view of dynamic allocation step 504 and NVM accessing step 506 of process 500 (FIG. 5). Process 600 may begin at step 602. Then, at step 604, data may be obtained at a host. For example, the host may include a processor for executing a memory driver that obtains the data from an application, the host's operating system, or from the host's file system.

Then, at step 606, a memory location in the non-volatile memory may be selected in which to store the obtained data. The memory location may include one, more than one, or all pages of a block that are in an erased state or can include multiple erased blocks of the non-volatile memory. In some embodiments, the memory location may be selected using a translation layer (e.g., flash translation layer) that maps logical addresses to physical addresses. At step 608, a decision can be made as to whether to store the data using SLC or MLC programming. The decision may be based on the reliability, performance, or speed of storage desired for the obtained data. For example, the higher reliability and performance of SLC programming may be desired for information critical to the operation of the memory system (e.g., boot data, NVM management data such as a physical-to-logical address index table, etc.).

Continuing to step 610, a mapping may be maintained between the memory location selected at step 606 and the SLC/MLC decision made at step 608. For example, the mapping may be stored in a lookup table that maps different memory locations to their corresponding SLC/MLC decisions. This way, when the data is read back out of the non-volatile memory device at some subsequent time, the host can use the appropriate SLC or MLC techniques to access the data. Then, at step 612, the data may be provided from the host to the raw or managed NVM package for storage in the NVM device. For example, the data may be provided from the host to an NVM controller included in the NVM package or to any circuitry (e.g., an address decoder) included in a raw NAND package.

In addition to the data, an address vector may be provided from the host to the NVM package at step 612. The address vector may indicate the memory location in which to store the data. The address vector may also indicate the result of the SLC/MLC decision made at step 608. In some embodiments, the address vector may be the same or similar to address vector 200 of FIG. 2, and the SLC/MLC decision may be indicated using one or more bits. Using an address vector to indicate the SLC/MLC decision may enable the host to dynamically allocate the memory location as being part of an SLC or MLC block.

At step 614, the memory location may be marked as an SLC or MLC memory location. For example, if the host determined that the data should be stored using MLC, the host may program metadata into pages of a selected block (or multiple blocks) using MLC programming techniques, where the metadata may indicate that the block has been dynamically allocated as a MLC block. Then, at step 616, the data may be stored into the memory location based on the SLC/MLC decision, such as using a page programming order selected based on the SLC/MLC decision. Once the data has been programmed and verified, process 600 may end at step 618.

Referring now to FIG. 7, a flowchart of illustrative process 700 is shown for reading data from a non-volatile memory device (e.g., flash memory device). The NVM device may be included in an NVM package, which may be a raw NVM package or a managed NVM package (e.g., including an NVM controller). The data stored in the NVM device may have been programmed using process 600 of FIG. 6 or using any other suitable approach, and therefore any suitable block or other memory location may currently be allocated as a SLC or MLC memory location. In some embodiments, process 700 may represent a more detailed view of NVM accessing step 506 of process 500 (FIG. 5).

Process 700 may begin at step 702. At step 704, a host may receive a request to retrieve data from the non-volatile memory device. For example, the host may include a processor for executing a memory driver, and the memory driver may receive the request from other drivers or software modules executed by the host's processor, such as from a file system, operating system, or an application. Then, at step 706, the memory location of where the requested data is stored may be identified (e.g., via a translation layer included in a memory driver). At step 708, a determination can be made as to whether the identified memory location is currently allocated as a SLC location or a MLC location. In some embodiments, this determination can be made by the host (e.g., via a memory driver executed by a host processor), such as by using a mapping maintained between memory locations and SLC/MLC decisions, as discussed above in connection with step 610 of FIG. 6. This way, if SLC programming was used to store the requested data, the host can determine that SLC techniques should be used to read the data back out. In other embodiments, the SLC/MLC determination can be made by components implemented within the NVM package, such as by an NVM controller.

Continuing to step 710, an address vector may be provided from the host to the raw or managed NVM package. The address vector may indicate the memory location identified at step 706. In some embodiments, the address vector may further indicate the result of the SLC/MLC determination made at step 708. For example, the address vector may be the same or similar as address vector 200 of FIG. 2. Then, at step 712, the memory location specified by the address vector may be read based on the SLC/MLC decision (e.g., in an order corresponding to the page programming order).

Once the memory location is read, process 700 may continue to step 714. At step 714, the metadata portion of the information read from the memory location may be interpreted to verify that the memory location was properly accessed. In particular, because pages of an SLC block may be marked as such using SLC programming techniques, the host or NVM package may not be able to accurately interpret the metadata stored in the pages if the memory location were accessed using MLC techniques. The host or NVM package, however, may be able to properly interpret the metadata portion if the SLC memory location were read using SLC access techniques. By verifying the metadata portion at step 714, the host or the NVM package can confirm that the mapping between the physical address and SLC/MLC decision was accurately maintained, and the host or NVM package can read the memory location using another approach if it is determined that the wrong approach was originally used. That is, if, at step 716, the host or NVM package determines that the verification step 714 failed, the memory location may be read again using different techniques (e.g., MLC techniques instead of SLC techniques, and vice versa).

If, at step 716, the host or NVM package determines instead that verification step 714 passed, process 700 can continue to step 718. At step 718, the data read from the NVM device may be provided from the NVM package to the host (e.g., host controller) that requested the data. Process 700 may then end at step 720.

It should be understood that processes 500, 600, and 700 of FIGS. 5-7, respectively, are merely illustrative. Any of the steps may be removed, modified, or combined, and any additional steps may be added, without departing from the scope of the invention. For example, in some embodiments, the host or NVM package may not use metadata to verify that a memory location has been accessed properly using SLC or MLC techniques and may rely on maintaining the mappings between memory locations and SLC/MLC decisions. In these embodiments, step 614 (FIG. 6) and step 714-718 (FIG. 7) may be removed from processes 600 and 700, respectively.

The described embodiments of the invention are presented for the purpose of illustration and not of limitation.

What is claimed is:

1. A method for programming a non-volatile memory, comprising:
    receiving data to store in memory cells of the non-volatile memory;
    receiving an indicator specifying a number of states per memory cell to use when programming the data to the memory cells; and
    programming the data to the memory cells in a program order associated with the number of states per memory cell,
    wherein the memory cells are arranged in a plurality of rows, each row comprising a group of memory cells, and the program order defines an order in which the rows are programmed within the memory,
    wherein the program order for rows of memory cells having more than one state per memory cell is not sequential,
    wherein first data is programmed to a first state of a first group of memory cells of a first row, followed by second data programmed to a first state of a second group of memory cells of a second row, followed later by third data programmed to a second state of the first group of memory cells of the first row.

2. The method of claim 1, wherein the program order for rows of memory cells having one state per memory cell is sequential.

3. The method of claim 1, wherein the indicator is part of the address vector for the program request.

4. A non-volatile memory, comprising:
    an array of memory cells arranged in rows, each row comprising at least one page of memory cells;
    an input for receiving data to store in the memory cells and an indicator specifying a number of states per memory cell to use when programming the data to the memory cells;
    circuitry that programs the data to one or more pages of memory cells in a program order, the program order associated with the number of states per memory cell; and
    a controller that determines the number of states per memory cell to use when programming the data based on a characteristic of the data, wherein the characteristic of the data comprises the source of the data.

5. The non-volatile memory of claim 4, wherein the program order defines an order in which the rows are programmed within the memory.

6. The non-volatile memory of claim 5, wherein the program order for rows of memory cells having one state per memory cell is sequential.

7. The non-volatile memory of claim 5, wherein the program order for rows of memory cells having more than one state per memory cell is not sequential.

8. The non-volatile memory of claim 7, wherein the circuitry programs first data to a first state of a first page of memory cells of a first row, followed by programming second data to a first state of a second page of memory cells of a second row, followed later by programming third data to a second state of the first page of memory cells of the first row.

9. The non-volatile memory of claim 4, wherein the indicator is part of an address vector for a program request.

10. An apparatus, comprising:
    a non-volatile memory comprising groups of memory cells arranged in rows, the non-volatile memory receives data and programs the data to one or more groups of memory cells according to a program order associated with a number of states per memory cell; and
    a controller that determines the number of states per memory cell to use when programming the data and transmits an indicator specifying the number of states per memory cell and the data to the non-volatile memory as part of a program request, wherein the program order defines an order in which the rows are programmed within the memory, wherein the program order for rows of memory cells having one state per memory cell is sequential, and wherein the program order for rows of memory cells having more than one state per memory cell is not sequential.

11. The apparatus of claim 10, wherein first data is programmed to a first state of a first group of memory cells of a first row, followed by second data programmed to a first state of a second group of memory cells of a second row, followed later by third data programmed to a second state of the first group of memory cells of the first row.

12. The apparatus of claim 10, wherein the indicator is part of an address vector of the program request.

13. The apparatus of claim 10, wherein the controller determines the number of states per memory cell to use when programming the data based on a characteristic of the data.

14. The apparatus of claim 13, wherein the characteristic of the data comprises the source of the data.

* * * * *